United States Patent [19]
McDonald et al.

[11] Patent Number: 5,623,206
[45] Date of Patent: Apr. 22, 1997

[54] NUCLEAR MAGNETIC RESONANCE (NMR) IMAGING

[75] Inventors: Peter J. McDonald, Surrey; Timothy B. Benson, Derby, both of England

[73] Assignee: British Technology Group Limited, London, England

[21] Appl. No.: 571,955

[22] PCT Filed: Jul. 29, 1994

[86] PCT No.: PCT/GB94/01640

§ 371 Date: Dec. 29, 1995

§ 102(e) Date: Dec. 29, 1995

[87] PCT Pub. No.: WO95/04288

PCT Pub. Date: Feb. 9, 1995

[30] Foreign Application Priority Data

Jul. 30, 1993 [GB] United Kingdom .................. 9315876

[51] Int. Cl.⁶ .................................................. G01R 33/20
[52] U.S. Cl. .......................................... 324/309; 324/314
[58] Field of Search .................................. 324/307, 309, 324/314, 312, 300

[56] References Cited

U.S. PATENT DOCUMENTS

| | | | |
|---|---|---|---|
| 4,509,015 | 4/1985 | Ordidge et al. | 324/309 |
| 4,833,411 | 5/1989 | McDonald et al. | 324/309 |
| 5,252,923 | 10/1993 | Cottrell et al. | 324/309 |
| 5,254,949 | 10/1993 | McDonald et al. | 324/309 |
| 5,369,362 | 12/1995 | Counsell | 324/309 |

FOREIGN PATENT DOCUMENTS

| | | |
|---|---|---|
| 259998 | 3/1988 | European Pat. Off. . |
| 9100529 | 1/1991 | WIPO . |
| 9100514 | 1/1991 | WIPO . |
| 9314416 | 7/1993 | WIPO . |

OTHER PUBLICATIONS

Y. Mat Daud et al, "Two–Dimensional Fourier transform NMR imaging of solids using large oscillatin field gradients", Physic B 176 (1992) 167–172.

Miller et al: "1H–Refocused Gradient Imaging of Solids", Journal of Magentic Resonance, vol. 82, No. 3, May 1, 1989, pp. 529–538, see p. 529—p. 532; figures 1,2.

Cory, et al: "NMR Images of Rotating Solids", Journal of Magnetic Resonance, vol. 76, No. 3, Feb. 15, 1988, pp. 543–547, see p. 543—p. 544; figure 1.

Roos, et al: "Spatial Localization in Stochastic NMR Imaging with Oscillating Gradients", Journal of Magnetic Resonance, vol. 87, No. 3, May 1, 1990, pp. 554–566, see the whole document.

(List continued on next page.)

*Primary Examiner*—Sandra L. O'Shea
*Assistant Examiner*—Raymond Y. Mah
*Attorney, Agent, or Firm*—Cushman, Darby & Cushman IP Group of Pillsbury Madison & Sutro LLP

[57] ABSTRACT

The invention describes an improved NMR imaging technique having particular application in imaging of solid objects using gradient echo techniques. By applying a so called 90° rf pulse substantially at zero gradient crossing it is possible to obtain frequency encoded information about an object being imaged, using a so called gradient echo technique. However, profile degradation occurs as a result of the very large magnetic fields which are used which spoil the rf pulse. By shortening the length of pulses below 90° it has been possible to improve gradient echo imaging. However, this has resulted in the reduction in the signal-to-noise ratio of the echo following each pulse. The present invention overcomes this problem by providing a rapidly oscillating magnetic field gradient and applying a radio frequency pulse away from a zero gradient crossing and by substantially phase rotating the resultant profile. The result is the surprising effect that information is preserved, the pulse bandwidth remains constant and the signal-to-noise ratio is superior to that in existing systems.

9 Claims, 3 Drawing Sheets

OTHER PUBLICATIONS

Li et al: "41P NMR Imaging of solid Bone with Solid Echos Combined with Refocused Gradients", Physics in Medicine and Biology, vol. 35, No. 8, Aug. 1, 1990, pp. 1153–1158, see the whole document.

Cottrell, et al: "NMR Imaging of Solids Using Large Oscillating Field Gradients", Measurment Science & Technology, vol. 1, No. 7, Jul. 1, 1990, pp. 624–629, cited in the application, see the whole document.

NUCLEAR MAGNETIC RESONANCE (NMR) IMAGING

This application claims benefit of international application PCT/GB97/01640, filed Jul. 29, 1994.

This invention relates to Nuclear Magnetic Resonance (NMR) Imaging and more particularly to an apparatus for and method of obtaining an improved NMR image of a solid object using a gradient echo technique.

The gradient echo technique, and techniques derived from discussed by S. P. Cottrell, M. R. Halse and J. H. Strange, Meas. Sci. Technol., 1 (1990) 624. and Y. Mat Daud and M. R. Halse, Physica B, 176 (1992) 167; have been developed for the magnetic resonance imaging of solids and other short $T_2$ systems. The basic apparatus and method employs a rapidly oscillating magnetic field gradient of large amplitude and is described and claimed in published UK Patent Application GB-A-8915090-8. In the arrangement a 90° radio frequency (rf) pulse is applied to a sample at a gradient zero crossing and a gradient echo, frequency encoded with spatial information, is acquired one gradient period later. Profile degradation due to finite pulses can be recovered in large part either by shifting the center of the pulse relative to the gradient zero crossing or alternatively by leaving the pulse centered on the zero crossing and applying a spatially dependent phase rotation to the resulting profile. In either case a modification to the linearisation procedure is required. The echo is linearised and Fourier transformed to yield a one dimensional profile in the gradient direction.

Although the arrangement described in the aforementioned Patent Application provided good resolution when used with liquids when used with solids, resolution was not perfect. It can be shown that the maximum number of pixels across a profile in normal gradient echo imaging is restricted to:

$$N_{max} = \frac{L}{\delta r} \approx \frac{2\tau}{t_{90} \sin\left(\frac{\pi t_{90}}{\tau}\right)}$$

where L is the sample length, wr the resolution, t the gradient period and $t_{90}$ the radio frequency pulse length. For a gradient period of t=80 ms and a pulse length of $t_p$=10 ms, $N_{max}$ is less than 42. This does not afford sensible spatial resolution.

An advantage of the aforementioned gradient echo technique is that the required bandwidth of the pulse is substantially reduced compared to previous techniques which, for example, require the gradient field to be on during the application of the rf pulse. However, in practice it is not possible to have infinitely short pulses, which would in any case, have an infinite bandwidth. Consequently the gradient is necessarily switching through zero during the period of application of the rf pulse and significantly degrades it. An understanding of the effect of the gradient during the period of application of the pulse leads to an understanding of a number of artifacts and errors previously encountered in gradient echo imaging experiments. In particular it is invariably found that the 'best' echo is double, rather than single, peaked, and phase rotated at its center. The resulting profiles suffer from a loss of resolution and intensity in the "wings". One way of overcoming these problems, is described in a paper by P. J. McDonald, K. L. Perry, S. P. Roberts entitled "A repetitive pulse variant of gradient echo imaging" now published: reference P. J. McDonald, K. L. Perry., S. P. Roberts Meas. Science Technology 4 (1993) 896–898. According to the paper, by using repetitive low flip angle pulses in a FLASH variant of gradient echo imaging, resolution is improved. However, a problem suffered by this type of gradient echo imaging has been that the length of pulses has been shortened and this has reduced the signal to noise of the echo following each pulse.

The present invention arose from a consideration of the pulse bandwidth and double peaked echo problems and overcomes the aforementioned problems and retains the advantages of using true 90° pulses.

International Patent Application Publication Number WO-AI-9006523 describes a method for selective excitation of NMR signals in which slice selection is achieved by use of a pulse and a gradient. The method is applicable to soft tissues.

According to a first aspect of the present invention there is provided a method of NMR imaging comprising the steps of: applying a static magnetic field and a rapidly oscillating magnetic field gradient to an object to be imaged; applying a radio frequency pulse away from a zero gradient crossing, and rotating the phase of the resulting profile by an amount which is dependent on the spatial coordinates, gradient period, gradient amplitude and pulse length.

As will be appreciated certain parameters are inter-related. Two such parameters may be varied In dependence on each other. These are firstly the duration of the interval between: zero gradient crossing and application of the radio frequency pulse (the so called pulse shift); and secondly the angle of phase rotation of the resulting profile. Thus by careful selection the phase of rotation may be brought to, or as close to, zero phase rotation as possible, by variation of the pulse shift. Alternatively the pulse shift may be brought to, or as close to, zero pulse shift as possible by variation of the phase of rotation of the resulting profile.

Thus it will be appreciated that further features of the invention provide inventively linked aspects.

According to a second aspect of the invention there is provided a method of NMR imaging in which the duration between the application of an rf pulse and zero gradient crossing (the pulse shift) can be chosen so that the required phase rotation of the resulting profile is zero.

According to a third aspect of the present invention there is provided a method of NMR imaging comprising applying a radio frequency pulse at a zero gradient crossing, and rotating the phase of the resulting profile.

According to a further aspect of the present invention there is provided apparatus for NMR imaging comprising means for applying a a static magnetic field and rapidly oscillating magnetic field gradient to an object to be imaged; means for applying a radio frequency pulse away from the zero gradient crossing, and means for rotating the phase of the resulting profile by an amount which is dependent on the spatial coordinates, gradient period, gradient amplitude and pulse length.

As will be appreciated certain parameters are inter-related. Two such parameters may be varied in dependence on each other. These are firstly the duration of the interval between: zero gradient crossing and application of the radio frequency pulse (the so called pulse shift); and secondly the angle of phase rotation of the resulting profile. Thus by careful selection the phase of rotation may be brought to or as close to zero phase rotation as possible, by variation of the pulse shift. Alternatively the pulse shift may be brought to, or as close to, zero pulse shift as possible by variation of the phase of rotation of the resulting profile.

Thus it will be appreciated that further features of the invention provide inventively linked aspects.

According to a yet further aspect of the invention there is provided apparatus for NMR imaging in which the duration between the application of an rf pulse and zero gradient crossing (the pulse shift) can be chosen so that the required phase rotation of the resulting profile is zero.

According to another aspect of the present invention there is provided apparatus for NMR imaging comprising means for applying a radio frequency pulse at a zero gradient crossing and rotating the phase of the resulting profile.

Features of the invention are surprising because it might be thought that shifting the pulse would require a pulse of even greater bandwidth than that required at zero gradient crossing. However as is shown, this is not so and indeed the problems are actually reduced by shifting the pulse, although the bandwidth is constant.

The term pulse shift may take any real value including any negative real value. It is defined as the interval between application of the rf pulse and gradient zero crossing. The fact that the pulse shift is negative means that the rf pulse is applied after zero gradient crossing.

Ways in which the invention may be performed will now be described, by way of example, with reference to the Figures in which.

Figure 3:
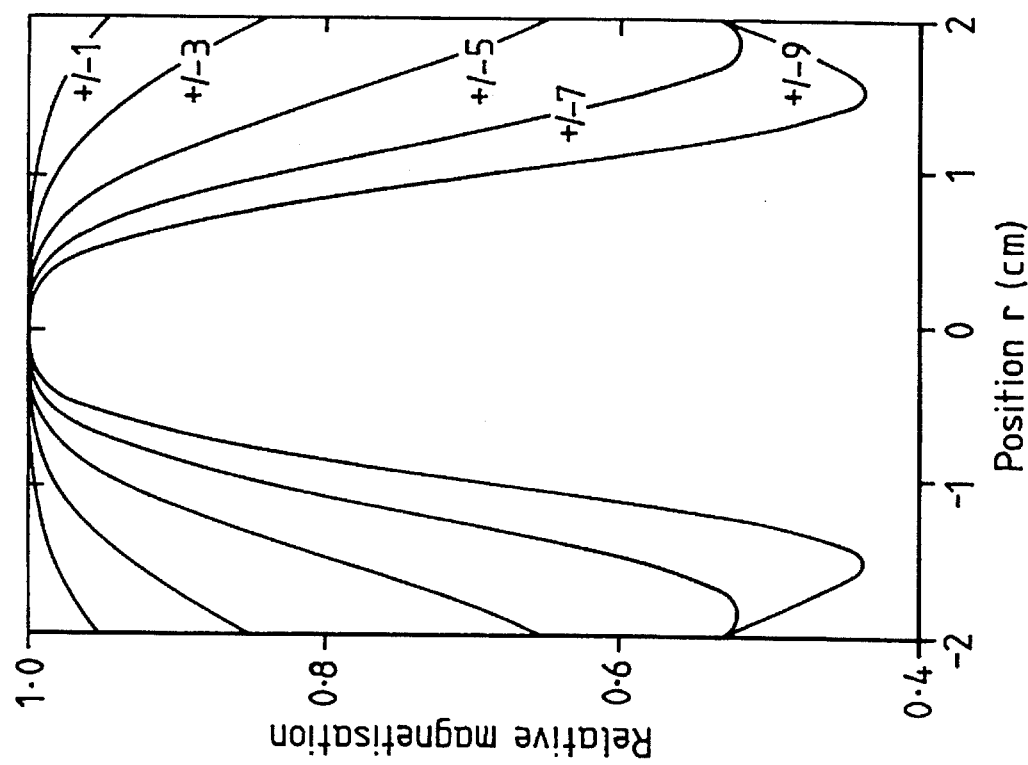
Figure 4C:
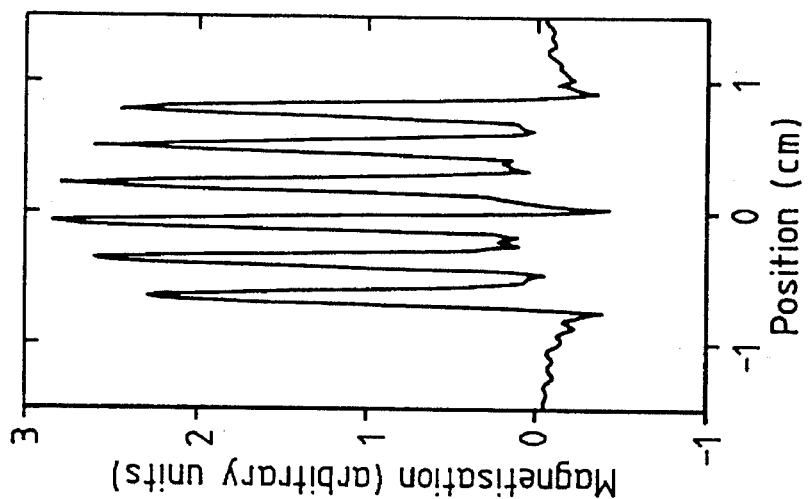
Figure 4B:
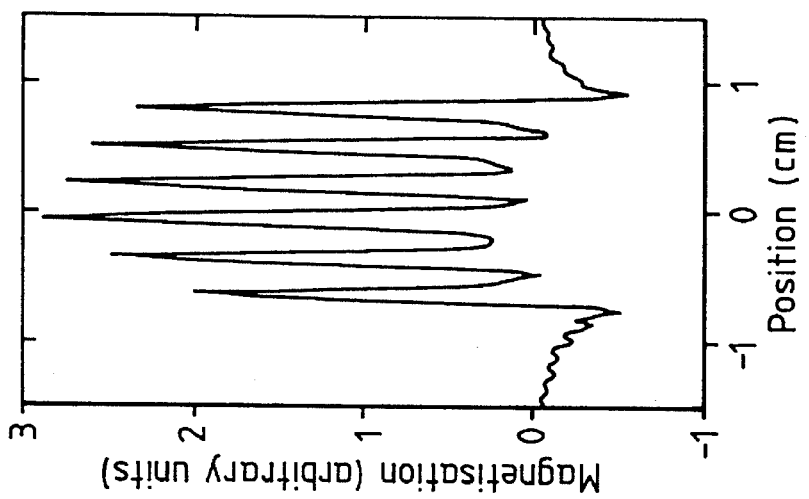
Figure 4A:
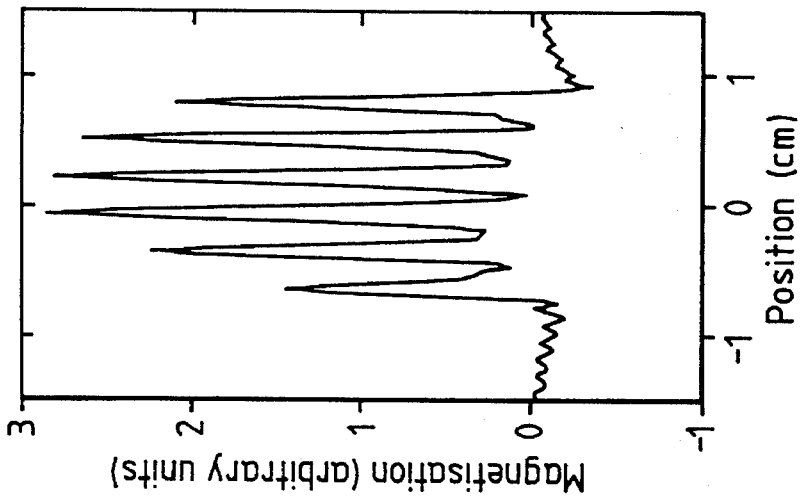

FIG. 3 shows diagrammatically the calculated amplitude of the (proton) transverse magnetisation following an rf pulse shift from the gradient zero crossing normalised to unity for a gradient period of 216 μs and amplitude of 27G/cm and a pulse of amplitude of 3G; and FIGS. 4(a)-(c) show diagrammatically $^1$H profiles of a rubber phantom made from six 1 mm slices of rubber separated by 2 mm; (a) using the unmodified gradient echo method, (b) using the unmodified gradient echo method but with subsequent profile rotation by 40° cm$^{-1}$ and (c) using an rf pulse shift from the gradient zero crossing by −3 μs. (In each case the absorption profile only is shown).

Figure 1:
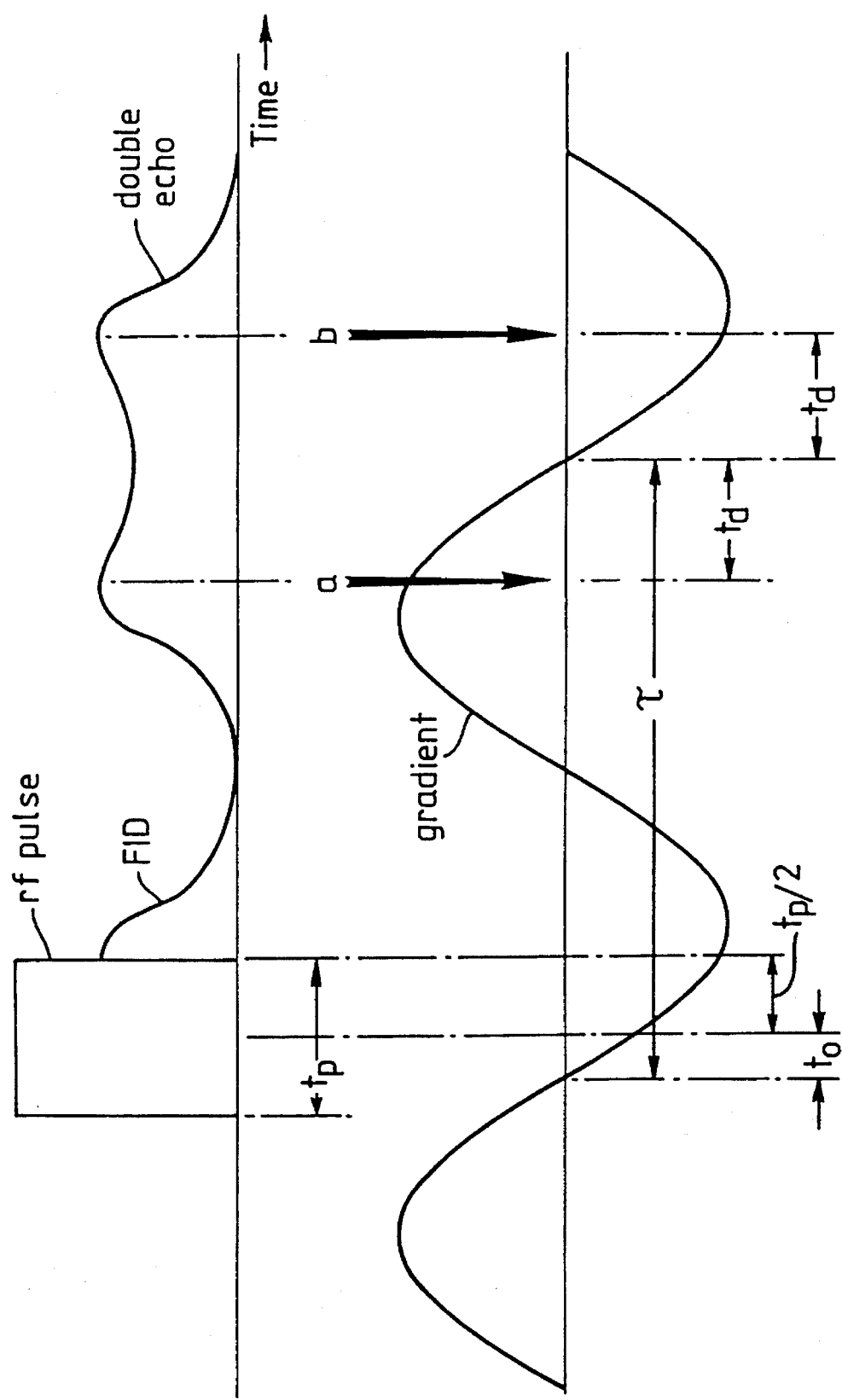
FIG. 1 is a detailed schematic view of the gradient zero crossing and pulse timing positioning, with magnetisation refocussed at the positions marked a and b indicated by vertical arrows.

FIG. 1 shows diagrammatically pulse time parameters, t, exaggerated compared to the gradient cycle time τ. It is Known that the size of the pulse shift or of the alternate phase rotation is primarily dependent on the pulse length, and to a lesser extent on the gradient amplitude and gradient period. The pulse shift '$t_o$' can be calculated by numerically integrating the Bloch equations (without relaxation) during the pulse. The evolution of the magnetisation which is initially in equilibrium along the z' axis of the rotating reference frame is followed as it precesses about the combined gradient and pulse fields. In the interval of time t to (t+δt) the gradient field in the z' direction is $$g_r r \sin\left(\frac{2\pi t}{\tau}\right)$$

where r is the laboratory position and $g_r$ is the gradient amplitude. τ is the gradient period. The corresponding pulse field (in the y' direction for a 90°$_{y'}$ pulse) is of magnitude $B_1$ and is on for the time interval $$-\frac{\pi}{4\gamma B_1} + t_o \ldots \frac{\pi}{4\gamma B_1} + t_o$$

where $t_o$ is the pulse shift measured from the gradient zero crossing at t=0 and γ is the magnetogyric ratio. This can be seen from the timing diagram in FIG. 1.

Figure 2:
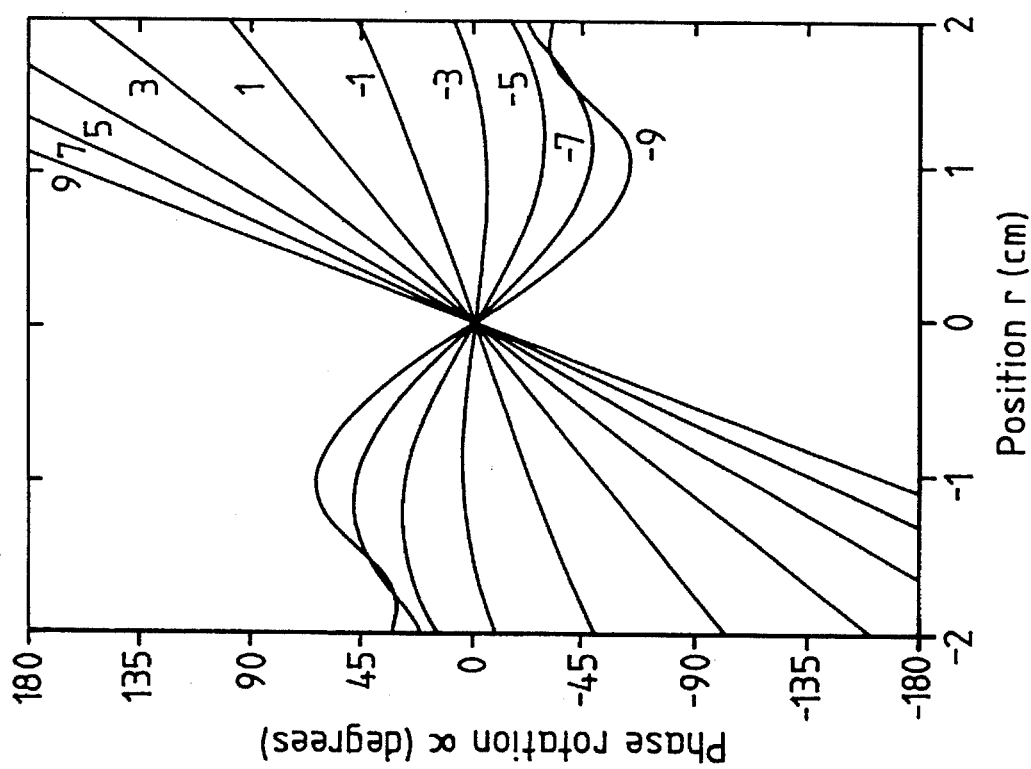
FIG. 2 shows diagrammatically the calculated phase of the (proton) transverse magnetisation following an rf pulse shift from the gradient zero crossing for a gradient period of 216 μs and amplitude of 27G/cm and a pulse of amplitude of 3G.

$B_g$ and $B_1$ give a resultant field of magnitude $B_{eff}=(B_g^2+B_1^2)^{1/2}$ inclined at an angle $\tan^{-1}(B_1/B_g)$ to the z' axis. The magnetisation precesses by an angle $\gamma B_{eff} \delta t$ during the interval δt about $B_{eff}$. As an example, FIG. 2 shows the phase, α, of the magnetisation in the x'y' plane relative to the x' axis following a nominal 90° pulse as a function of r for a proton NMR experiment with a gradient amplitude of $g_r$=27G/cm, a pulse amplitude of $B_1$=3G and a gradient period of τ=216 μs. The pulse length $t_p$, is therefore approximately 20 μs. Each curve is for a different offset. The phase is shown for pulse center offsets, $t_o$, ranging from −9 to 9 μs. It is seen that the optimum offset is approximately equal to −3 μs in this case. For this offset the phase shift is nearly zero across the whole profile width.

The projection amplitude of the magnetisation in the x'y' plane immediately following this same pulse is shown in FIG. 3. The pulse amplitude is 3G, the gradient amplitude is 27G/cm and the gradient period is 216 μs. Each curve is for a different offset in the range −9 to 9 μs. It is seen that in large part all the magnetisation ends up in this plane. For an offset of −3 μs, 85% or more is available over a 4 cm profile length.

If the pulse is not shifted in time, $t_o$=0, then a phase rotation must be applied to the resulting absorption and dispersion profile data obtained after echo Fourier Transformation (FT) to give the true absorption profile. This is because the nuclei at position r refocus not along the x' axis but at an angle α(r) to it. FIG. 2 shows that for $t_o$=0 α(r) is approximately linear over the whole profile width. In the ideal case of no noise and also of positive magnetisations the same effect as the phase rotation can be achieved by taking the modulus of the data. However, this is generally less satisfactory and is not always possible. For instance, spin lattice relaxation time weighted echoes following an earlier inversion pulse can lead to both positive and negative magnetisations at different points across the profile width.

The echo linearisation is needed prior to Fourier Transformation to convert the recorded echo to that which would have been recorded had the gradient been constant. The assumption of the original gradient echo method is that the transverse magnetisation is in phase at the instant of the pulse which is also a gradient zero crossing. The magnetisation is refocussed exactly one gradient cycle later. Consequently the magnetisation to be Fourier transformed, M'(t') equals the measured magnetisation M(t) recorded at a shifted time according to $$t = \tau +/- \frac{\tau}{2\pi} \cos^{-1}\left(1 - \frac{4|t'|}{\tau}\right)$$

where the positive is taken for t>τ and the negative for t<τ as discussed by S. P. Cottrell, M. R. Halse and J. H. Strange, in Meas. Sci. Technol., 1 (1990) 624., and by Y. Mat Daud and M. R. Halse in Physica B, 176 (1992) 167 and by R. J. Ordidge and P. Mansfield, in U.S. Pat. No. 4,509,015. The origin of t' is taken as the echo center.

More precisely, however, the time at which the magnetisation is initially in phase (or at least the phase is known) is immediately following the pulse. This is not coincident with the first gradient crossing. The spins are refocussed each time the integrated gradient field is zero following the end of the pulse. There are two such events, labelled a and b in FIG. 1 close to the end of the gradient cycle where this is achieved. This is the origin of the double peaked echo generally observed. The first half of the echo to be recorded can be determined from the data leading up to the refocussing labelled a in FIG. 1, during the time interval τ/2 to τ–$t_d$ and the second half from the data following the refocussing labelled b, during the interval τ+$t_d$ to 3τ/2 where $$t_d = \frac{t_p}{2} - t_o$$

Hence $$t = \tau +/- \frac{\tau}{2\pi} \cos^{-1}\left(\cos\left(\frac{2\pi t_d}{\tau}\right) - \frac{2|r'|}{\tau}\left(1 + \cos\left(\frac{2\pi t_d}{\tau}\right)\right)\right)$$

As in the original implementation the sign of the imaginary part of the first half gradient echo must be inverted.

A particular experiment is now described with reference to FIG. 4 which shows three absorption $^1$H density profiles of a rubber phantom consisting of 6 rubber slices 1 mm thick and separated by 2 mm TEFLON (Registered Trade Mark) spacers obtained by gradient echo imaging using the same parameters as for the above simulation. These profiles were obtained using a MAGNEX SCIENTIFIC LTD., superconducting magnet and actively shielded gradient set together with an SMIS LTD., NMR imaging console modified for the solid state working at 30 MHz.

FIG. 4a shows a profile which was produced with $t_o=0$, that is with the pulse and gradient zero crossing carefully aligned using a search coil in the magnet and an oscilloscope triggered from the pulse. The echo data was analysed without any correction to the reconstruction algorithm. FIG. 4b shows the effect of correctly sampling the same data set and applying a phase rotation of 40° cm$^{-1}$, determined from FIG. 2, to the absorption and dispersion data to yield the true absorption profile. Finally FIG. 4c shows the results of a second experiment in which the pulse is shifted by −3 μs (using software control) and the echo correctly sampled. No rotation is applied in this case. The improved profile quality in FIG. 4b and particularly in 4c is clearly evident.

The refocussing gradient applied after selective excitation in liquid state magnetic resonance imaging Is discussed by R. J. Sutherland and by J. M. S. Hutchison, in J. Phys. E Sci. Instrum., 11 (1978) 79, D. R. Bailes and D. J. Bryant, Contemp. in Phys. 25 (1984) 441 and by P. T. Callaghan, "Principles of Nuclear Magnetic Resonance Spectroscopy" 1991, Clarendon Press, pages 98–115. The refocussing gradient applied after selective excitation in liquid state magnetic resonance imaging is, in retrospect, analogous to the phase shift described here. However one does not obviously follow from the other, since the gradient during the pulse is time dependent in gradient echo imaging and not constant as in selective excitation and the rewind is achieved during the rf pulse and not after it. The effect of the pulse shift in gradient echo imaging is to unbalance the integrated amplitude of the gradient acting in the first and second halves of the pulse. The unbalanced part of the gradient is analogous to the rewind gradient. It is found that the required pulse shift is of order 0.14 of the pulse width. This is undoubtedly related to the fact that for a linearly changing gradient during the pulse with an offset of approximately 0.14$t_p$, the magnitude of the time integral of the unbalanced part of gradient is equal to the net magnitude of the two balanced parts. Symmetries of this kind are also reminiscent of selective excitation.

The need to account carefully for the finite pulse length in gradient echo imaging has been discussed and the improvements to profile quality obtainable have been demonstrated. The modifications are particularly relevant to the implementation of gradient echo imaging when it is not possible to approximate to the short pulse ideal, such as with low rf power due to large sample volumes and short gradient cycles due to short $T_2$'s.

It will be appreciated that the aforementioned embodiment has been described by way of example only and that variation to it may be made without departing from the scope of the invention.

I claim:

1. A method of NMR imaging comprising the steps of: applying a static magnetic field and a rapidly oscillating magnetic field gradient, for generating gradient echoes, to a solid object to be imaged, said gradient oscillating sinusoidally in amplitude about a zero value; applying a radio frequency (rf) pulse away from a zero gradient crossing, and rotating the phase of the resulting profile by an amount which is dependent upon the spatial coordinates, gradient period, gradient amplitude, pulse length and pulse offset.

2. A method according to claim 1 in which any one of the parameters from the set of: spatial coordinates, gradient period, gradient amplitude, pulse length and pulse offset is varied in dependence upon each other.

3. A method according to claim 2 wherein the interval between zero gradient crossing and application of a radio frequency pulse is varied.

4. A method according to claim 2 wherein the angle of phase of rotation of the resulting profile is varied.

5. A method according to claim 2 wherein the phase of rotation is arranged to be substantially zero by variation of the time interval between zero gradient crossing and application of the radio frequency pulse.

6. A method according to claim 2 wherein the time interval between zero gradient crossing and application of the radio frequency pulse is arranged to be substantially zero by variation of the angle of phase of rotation of the resulting profile.

7. A method of NMR imaging comprising the steps of applying a static magnetic field and a rapidly oscillating magnetic field gradient, for generating gradient echoes, to a solid object to be imaged, said gradient oscillating sinusoidally in amplitude about a zero value; applying a radio frequency (rf) pulse away from a zero gradient crossing, characterised in that the time interval between application of the radio frequency pulse and the zero gradient crossing is chosen such that the required phase rotation of the resulting profile is substantially zero.

8. A method according to claim 7 wherein the pulse shift may take any real value: including any negative real value.

9. Apparatus for NMR imaging comprising: means for applying a static magnetic field and a rapidly oscillating magnetic field gradient to an object to be imaged; means for applying a radio frequency pulse away from the zero gradient crossing, and means for rotating the phase of the resulting profile by an amount which is dependent upon the spatial coordinates, gradient period, gradient amplitude, pulse offset and pulse length.

* * * * *